(12) United States Patent
Tang

(10) Patent No.: US 12,293,971 B2
(45) Date of Patent: May 6, 2025

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Zhongdi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 489 days.

(21) Appl. No.: 17/451,667

(22) Filed: Oct. 21, 2021

(65) Prior Publication Data

US 2022/0216160 A1 Jul. 7, 2022

Related U.S. Application Data

(63) Continuation of application No. PCT/CN2021/108908, filed on Jul. 28, 2021.

(30) Foreign Application Priority Data

Jan. 4, 2021 (CN) .......................... 202110003498.7

(51) Int. Cl.
*H01L 23/532* (2006.01)
*H01L 21/768* (2006.01)
(Continued)

(52) U.S. Cl.
CPC .. *H01L 23/53238* (2013.01); *H01L 21/76807* (2013.01); *H01L 21/76834* (2013.01);
(Continued)

(58) Field of Classification Search
CPC ......... H01L 23/53228; H01L 23/53238; H01L 23/553295; H01L 23/53283; H01L 21/768;
(Continued)

(56) References Cited

U.S. PATENT DOCUMENTS

| 2004/0137721 | A1 | 7/2004 | Lim et al. |
| 2015/0348835 | A1* | 12/2015 | Deng ................ H01L 21/76867 438/653 |
| 2018/0261546 | A1* | 9/2018 | Bark .................. H01L 23/5226 |

FOREIGN PATENT DOCUMENTS

| CN | 1753162 A | 3/2006 |
| CN | 102054762 A | 5/2011 |

(Continued)

OTHER PUBLICATIONS

International Search Report as cited in PCT/CN2021/108908 mailed Nov. 3, 2021, 8 pages.

(Continued)

*Primary Examiner* — Thanhha S Pham
(74) *Attorney, Agent, or Firm* — Kilpatrick Townsend & Stockton LLP

(57) ABSTRACT

Embodiments of the present application provide a semiconductor structure and a formation method thereof. The semiconductor structure formation method includes: providing a substrate, a dielectric layer on the substrate, the dielectric layer having a trench; forming a metallic copper layer filling the trench; forming a contact layer on an upper surface of the metallic copper layer, a material of the contact layer containing cuprous ions; and forming a barrier layer on an upper surface of the contact layer, a material of the barrier layer containing a same element as the material of the contact layer. The embodiments of the present application help improve a contact effect between the metallic copper layer and the barrier layer.

14 Claims, 4 Drawing Sheets

(51) Int. Cl.
*H01L 23/528* (2006.01)
*H10B 12/00* (2023.01)

(52) U.S. Cl.
CPC .... *H01L 21/76837* (2013.01); *H01L 23/5283* (2013.01); *H10B 12/01* (2023.02)

(58) Field of Classification Search
CPC ......... H01L 21/76831; H01L 21/76832; H01L 21/76834; H01L 21/76841; H01L 21/76843; H01L 21/76844; H01L 21/76846; H01L 21/76849; H01L 21/7685; H01L 21/76853; H01L 21/76855; H01L 21/76861; H01L 21/76864

See application file for complete search history.

(56) References Cited

FOREIGN PATENT DOCUMENTS

| | | |
|---|---|---|
| CN | 102915958 A | 2/2013 |
| CN | 106356457 A | 1/2017 |
| CN | 106356457 B | 7/2019 |

OTHER PUBLICATIONS

Pattanasattayavong, et al., "Electric field-induced hole transport in copper (I) thiocyanate (CuSCN) thin-films processed from solution at room temperature", Chem. Commun. 49 (2013) 4154-4156.

Tsai, et al., "Improvement of OLED performances by applying annealing and surface treatment on electro-deposited CuSCN hole injection layer", Synthetic Metals. 269 (2020) 116537, 8 pages.

\* cited by examiner

SEMICONDUCTOR STRUCTURE AND FORMATION METHOD THEREOF

CROSS-REFERENCE TO RELATED APPLICATIONS

This application is a continuation of International Patent Application No. PCT/CN2021/108908, filed on Jul. 28, 2021, which is based on and claims priority to Chinese Patent Application No. 202110003498.7, filed on Jan. 4, 2021. The entire contents of International Patent Application No. PCT/CN2021/108908 and Chinese Patent Application No. 202110003498.7 are incorporated herein by reference.

TECHNICAL FIELD

Embodiments of the present application relate to the field of semiconductors, and in particular, to a semiconductor structure and a formation method thereof.

BACKGROUND

A Dynamic random access memory (DRAM) is a semiconductor memory widely used in multi-computer systems. With the rapid development of a semiconductor integrated circuit device, requirements on a contact effect between structures of the semiconductor integrated circuit device are becoming higher and higher.

A metallic copper layer plays an important role in interconnection between integrated circuits. In the prior art, a barrier layer is formed on a surface of the metallic copper layer to prevent diffusion of the metallic copper layer to other regions. However, a contact effect between the metallic copper layer and the barrier layer is poor, and the metallic copper layer easily diffuses along a contact surface with the barrier layer to form an air gap or a projection in the semiconductor structure.

How to improve the contact effect between the metallic copper layer and the barrier layer becomes an urgent problem to be solved by those skilled in the art.

SUMMARY

The embodiments of the present application provide a semiconductor structure and a formation method thereof, which help solve the problem of the poor contact effect between the metallic copper layer and the barrier layer.

According to some embodiments, in a first aspect, the present application provides a method of forming a semiconductor structure, including: providing a substrate, a dielectric layer on the substrate, the dielectric layer having a trench; forming a metallic copper layer filling the trench; forming a contact layer on an upper surface of the metallic copper layer, a material of the contact layer containing cuprous ions; and forming a barrier layer on an upper surface of the contact layer, a material of the barrier layer containing a same element as the material of the contact layer.

According to some embodiments, in a second aspect, the present application further provides a semiconductor structure, including: a substrate, the substrate having a dielectric layer, the dielectric layer having a metallic copper layer, and the dielectric layer exposing an upper surface of the metallic copper layer; a contact layer, the contact layer being located on the upper surface of the metallic copper layer, and a material of the contact layer containing cuprous ions; and a barrier layer, the barrier layer being located on an upper surface of the contact layer, and a material of the barrier layer containing a same element as the material of the contact layer.

The embodiments of the present application may have the following advantages.

In the semiconductor structure formation method according to the first aspect of the embodiments of the present application, a contact layer is formed between a metallic copper layer and a barrier layer, a material of the contact layer contains cuprous ions, and the material of the contact layer contains same elements as a material of the barrier layer. The contact layer contains cuprous ions, which has similar chemical properties to the metallic copper layer; therefore, the contact layer formed on the upper surface of the metallic copper layer has good adhesion with the metallic copper layer, and no gap exists between the metallic copper layer and the contact layer. At the same time, since the material of the contact layer contains same elements as the material of the barrier layer, the contact layer and the barrier layer also have similar chemical properties and good adhesion therebetween. Based on the above, two opposite sides of the contact layer are closely bonded with the metallic copper layer and the barrier layer respectively, and no air gap or projection exists between the metallic copper layer and the barrier layer, which improves the contact performance of the metallic copper layer and the barrier layer.

In the semiconductor structure formation method according to the second aspect of the embodiments of the present application, a buffer layer is formed between a dielectric layer and a barrier layer, and an upper surface of the buffer layer is flush with an upper surface of the contact layer. The contact layer contains cuprous ions; in order to prevent contact of the two sides of the contact layer with other structures in the semiconductor structure to conduct electricity, the buffer layer is formed on the two sides of the contact layer to achieve isolation and insulation effects, which helps improve the security of the semiconductor structure.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

It can be known from the Background that the contact effect between the metallic copper layer and the barrier layer in the prior art is poor.

Figure 1:
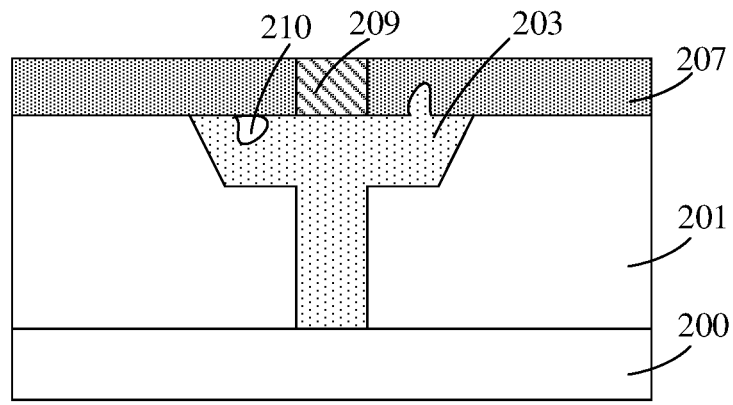
FIG. 1 is a schematic structural diagram of a semiconductor structure.

Referring to FIG. 1, a semiconductor structure includes: a substrate 200, a dielectric layer 201, a metallic copper layer 203, a barrier layer 207 and a metal layer 209.

The barrier layer 207 is located on an upper surface of the dielectric layer 201 and an upper surface of the metallic copper layer 203. Due to a poor contact effect between the metallic copper layer 203 and the barrier layer 207, a gap exists between the metallic copper layer 203 and the barrier layer 207. After a metal layer 209 electrically connected to the metallic copper layer 203 is formed, flow of electrons causes a physical form of the metallic copper layer 203 to become active, and the metallic copper layer 203 flows between the gaps. Portion of the metallic copper layer 203 is raised, forming an air gap 210 between the metallic copper layer 203 and the barrier layer 207, which reduces the performance of the semiconductor structure.

In order to solve the above problem, in a method of forming a semiconductor structure according to an embodiment of the present application, a contact layer is formed between a metallic copper layer and a barrier layer, a material of the contact layer contains cuprous ions, and the material of the contact layer contains same elements as a material of the barrier layer, which improves a contact effect between the metallic copper layer and the barrier layer in the semiconductor structure.

In order to make the objectives, technical solutions and advantages of the embodiments of the present application clearer, various embodiments of the present application will be described below in details with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

FIG. 2 to FIG. 11 are schematic structural diagrams corresponding to steps of a method of forming a semiconductor structure according to a first embodiment of the present application. The semiconductor structure formation method according to the first embodiment of the present application is described in detail below with reference to the accompanying drawings.

Figure 2:
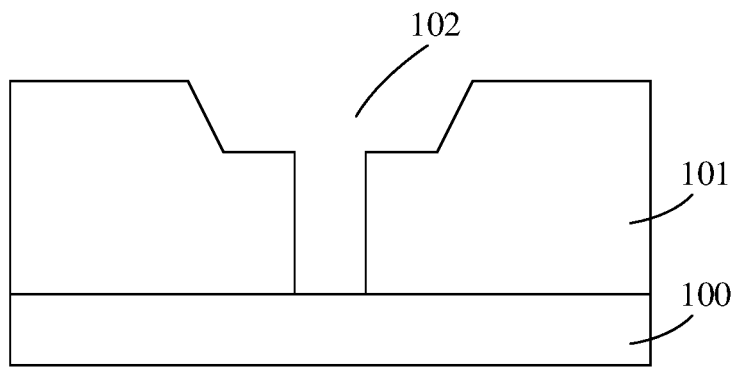
FIG. 2 to FIG. 11 are schematic structural diagrams corresponding to steps of a method of forming a semiconductor structure according to a first embodiment of the present application.

Referring to FIG. 2, the semiconductor structure formation method according to the first embodiment of the present application includes: providing a substrate 100, a dielectric layer 101 on the substrate 100, and the dielectric layer 101 having a trench 102.

The substrate 100 may be made of sapphire, silicon, silicon carbide, gallium arsenide, aluminum nitride, zinc oxide or the like. In this embodiment, the substrate 100 is made of a silicon material.

The dielectric layer 101 is formed on a surface of the substrate 100. The dielectric layer 101 may be formed by a chemical vapor deposition process. In other embodiments, the dielectric layer may also be formed by an atomic layer deposition process.

The dielectric layer 101 may be silicon oxide or a high dielectric material. The high dielectric material is specifically a ferroelectric ceramic material, a barium titanate based material or a lead titanate based material.

In this embodiment, the trench 102 is formed in the dielectric layer 101. The trench 102 may be formed by a dual damascene process, and the dual damascene process includes a via first trench last method and a via last trench first method.

Figure 3:
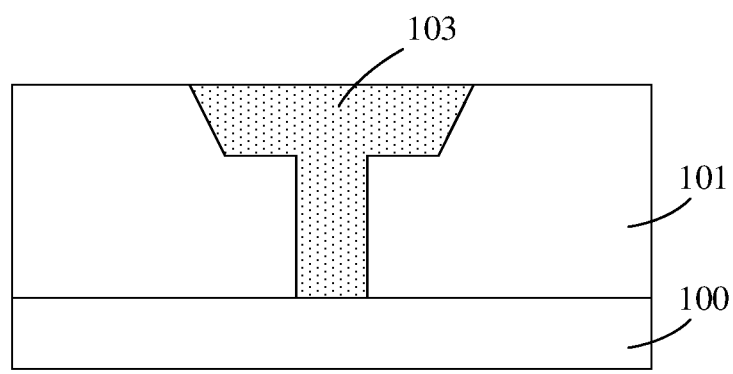

Referring to FIG. 3, a metallic copper layer 103 filling the trench 102 (refer to FIG. 2) is formed. The metallic copper layer 103 may be formed by a chemical vapor deposition process. In other embodiments, the metallic copper layer may also be formed by an atomic layer deposition process.

Figure 4:
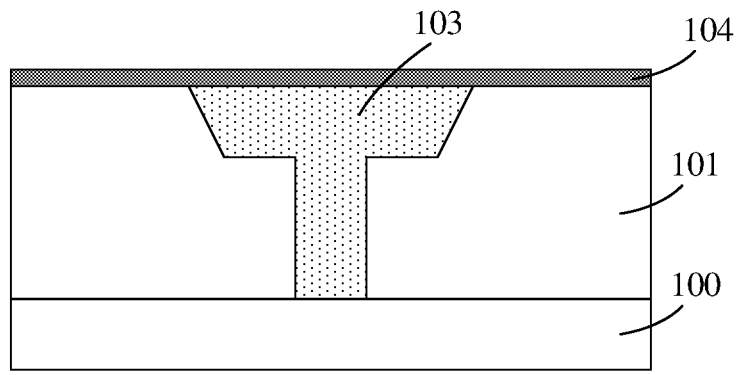

Referring to FIG. 4, a buffer layer 104 is formed on an upper surface of the dielectric layer 101 and an upper surface of the metallic copper layer 103.

The buffer layer 104 is formed between the dielectric layer 101 and the barrier layer. The contact layer contains cuprous ions; in order to prevent contact of the two sides of the contact layer with other structures in the semiconductor structure to conduct electricity, the buffer layer 104 is formed on the two sides of the contact layer to achieve isolation and insulation effects, which helps improve the security of the semiconductor structure.

The buffer layer 104 may be formed by an atomic layer deposition process. The buffer layer 104 of a uniform thickness can be formed on the dielectric layer 101 and the metallic copper layer 103 through the atomic layer deposition process. In other embodiments, the buffer layer may also be formed by a chemical vapor deposition process.

The buffer layer 104 has isolation and insulation functions. The buffer layer 104 may be made of silicon nitride, silicon oxide or the like.

In this embodiment, the buffer layer 104 has a thickness ranging from 5 nm to 10 nm, which may specifically be 6 nm, 7 nm or 8 nm. The buffer layer 104 is required to have only isolation and insulation functions. Therefore, the formed buffer layer 104 has a smaller thickness, which helps save manufacturing costs of the semiconductor structure.

Figure 5:
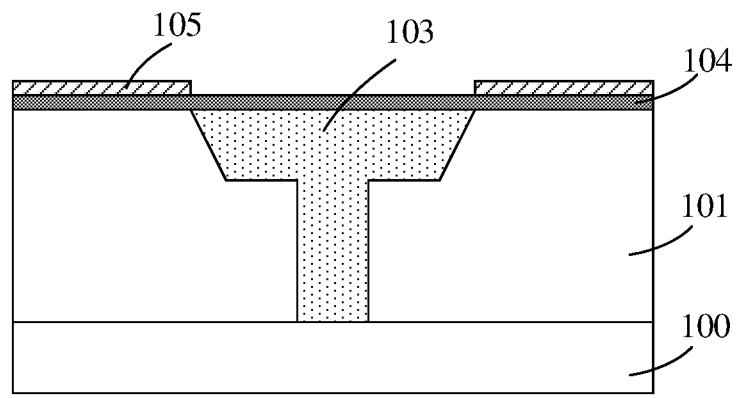
Figure 6:
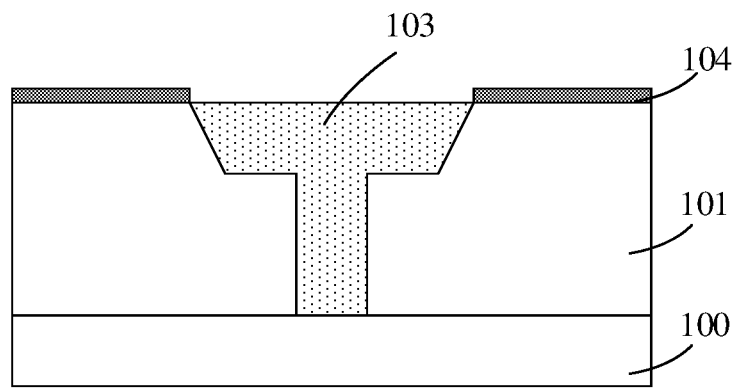

Referring to FIG. 5 and FIG. 6, portion of the buffer layer 104 located on the upper surface of the metallic copper layer 103 is removed to expose at least the upper surface of the entire metallic copper layer 103.

In this embodiment, the step of etching to remove a portion of the buffer layer 104 located on the upper surface of the metallic copper layer 103 includes the following steps.

A photoresist 105 is formed on portion of the buffer layer 104 located on the upper surface of the dielectric layer 101, which may be divided into a negative photoresist and a positive photoresist according to its chemical reaction mechanism and development principle. In this embodiment, the portion of the buffer layer 104 located on the upper surface of the metallic copper layer 103 is removed using the positive photoresist.

An exposure and development step is performed to remove the portion of the buffer layer 104 located on the upper surface of the metallic copper layer 103. The photoresist 105 is etched by oxygen-containing plasma, and the photoresist 105 is removed.

Figure 7:
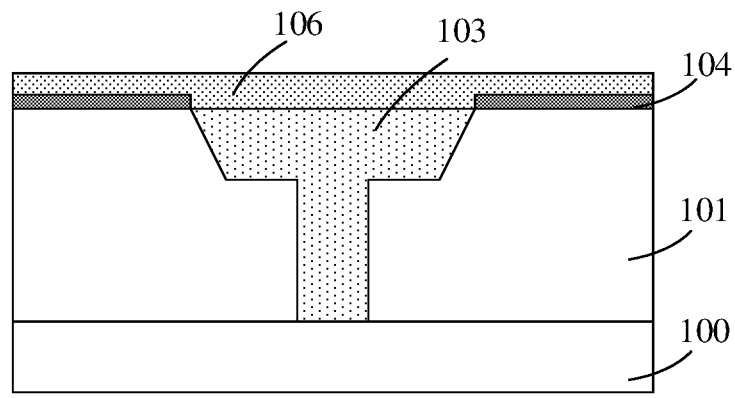
Figure 8:
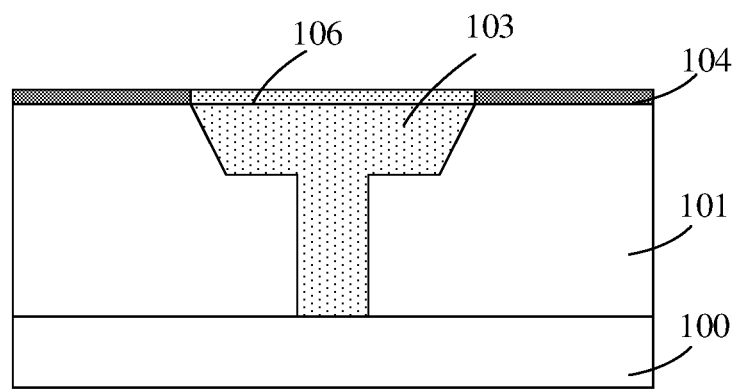

Referring to FIG. 7 and FIG. 8, after the portion of the buffer layer 104 located on the upper surface of the metallic copper layer 103 is removed, a contact layer 106 is formed on the exposed upper surface of the entire metallic copper layer 103, and the upper surface of the contact layer 106 is flush with an upper surface of a remaining portion of the buffer layer 104.

In this embodiment, the step of forming a contact layer 106 involves: forming an initial contact layer by a Spin-On-Dielectric (SOD) process. In the SOD process, firstly, the substrate 100, the dielectric layer 101 and the metallic copper layer 103 are rotated at a certain speed; at the same time, a fluid precursor is provided for the upper surface of the metallic copper layer 103, and the precursor is subjected to a centripetal force of rotation on the upper surface of the metallic copper layer 103, and under the centripetal force, diffuses in all directions to form a uniform initial contact layer of fluid that fills an air gap between the metallic copper layer 103 and the buffer layer 104; subsequently, a solid contact layer 106 is formed by sintering in an aerobic environment.

The initial contact layer is formed by an SOD process. Due to the centripetal force of rotation, the formed initial contact layer uniformly fills the air gap between the metallic copper layer 103 and the buffer layer 104.

In other embodiments, the initial contact layer may also be formed by a Flowable Chemical Vapor Deposition (FCVD) process.

In this embodiment, the spin-on-dielectric process includes: the substrate 100, the dielectric layer 101 and the metallic copper layer 103 rotating at a rate of 500 to 3000 revolutions per minute during the formation of the initial contact layer by spin-on-dielectric, which may specifically be 1000 revolutions per minute, 1500 revolutions per minute or 2000 revolutions per minute.

After the initial contact layer is formed, the initial contact layer is thermally treated to form the contact layer 106. The thermal treatment involves sintering the initial contact layer in an aerobic environment to form the solid contact layer 106.

In this embodiment, the thermal treatment process includes: a process temperature ranging from 70° C. to 80° C. during the thermal treatment to the initial contact layer, which may specifically be 73° C., 76° C. or 79° C.; and a process duration ranging from 10 minutes to 20 minutes, which may specifically be 13 minutes, 16 minutes or 19 minutes.

The material of the contact layer 106 contains cuprous ions, which may specifically be cuprous thiocyanate. The contact layer 106 contains cuprous ions, which has similar chemical properties to the metallic copper layer 103; therefore, the contact layer 106 formed on the upper surface of the metallic copper layer 103 has good adhesion with the metallic copper layer 103, and no gap exists between the metallic copper layer 103 and the contact layer 106.

Referring to FIG. 7, the formed contact layer 106 is not only on the upper surface of the metallic copper layer 103 but also on the upper surface of the buffer layer 104, and the upper surface of the contact layer 106 is higher than an upper surface of a remaining portion of the buffer layer 104; in order to make the upper surface of the contact layer 106 flush with the upper surface of the remaining portion of the buffer layer 104, Chemical Mechanical Polishing (CMP) is required to be performed on the contact layer 106.

The contact layer 106 located on the upper surface of the buffer layer 104 is removed by the chemical mechanical polishing, so that the upper surface of the contact layer 106 after the chemical mechanical polishing is flush with the upper surface of buffer layer 104, and the upper surface of the contact layer 106 after the chemical mechanical polishing is flatter. When the barrier layer is subsequently formed on the contact layer 106, since the upper surface of the contact layer 106 is relatively flat, no gap may be generated between the contact layer 106 and the barrier layer due to the roughness of the upper surface of the contact layer 106.

During the removal of portion of the contact layer 106 by the chemical mechanical polishing, a polishing time may specifically be 10 s to 50 s, such as 20 s, 30 s or 40 s.

The contact layer 106 is cleaned after the chemical mechanical polishing. A cleaning liquid used in the cleaning may be made of ammonia and pure water in a ratio of 4:1 to 1:1, which may specifically be 2:1.

The contact layer 106 formed after the chemical mechanical polishing has a thickness of 5 nm to 10 nm, which may specifically be 6 nm, 7 nm or 8 nm.

The contact layer 106 has a same thickness as the buffer layer 104. The upper surface of the contact layer 106 and the upper surface of the buffer layer 104 form a uniform and flat surface, which facilitates subsequent formation of a barrier layer by deposition. Moreover, the contact layer 106 is required to only play a role of connecting the metallic copper layer 103 and the barrier layer. Therefore, the formed contact layer 106 has a smaller thickness, which helps save manufacturing costs of the semiconductor structure.

Figure 9:
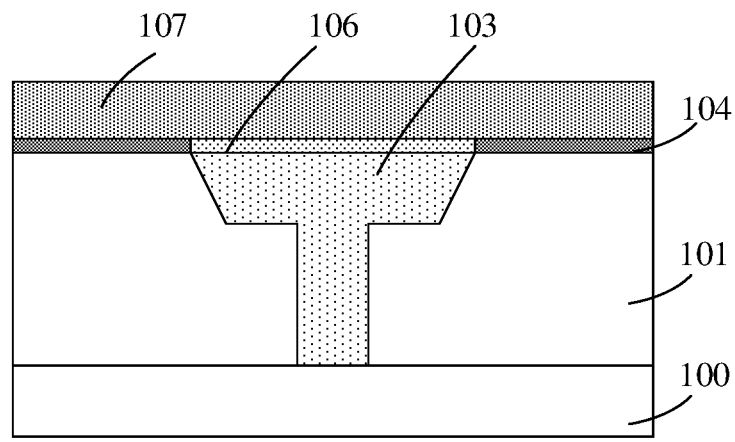

Referring to FIG. 9, a barrier layer 107 is formed on the upper surface of the contact layer 106.

In this embodiment, the step of forming a barrier layer 107 includes: forming the barrier layer 107 on the upper surface of the contact layer 106 and the upper surface of the remaining portion of the buffer layer 104. The barrier layer 107 may be formed by a chemical vapor deposition process. In other embodiments, the barrier layer may also be formed by an atomic layer deposition process.

In this embodiment, the material of the barrier layer 107 contains a same element as the material of the contact layer 106. Specifically, the material of the barrier layer 107 may be silicon carbon nitride. In other embodiments, the material of the barrier layer may also be tantalum nitride and other tantalum compounds.

Since the material of the contact layer 106 contains a same element as the material of the barrier layer 107, the contact layer 106 and the barrier layer 107 also have similar chemical properties and good adhesion therebetween, and no gap exists between the barrier layer 107 and the contact layer 106. It can be obtained that two opposite sides of the contact layer 106 are closely bonded to the metallic copper layer 103 and the barrier layer 107 respectively, and no air gap or projection exists between the metallic copper layer 103 and the barrier layer 107, which improves the contact performance of the metallic copper layer 103 and the barrier layer 107.

Figure 10:
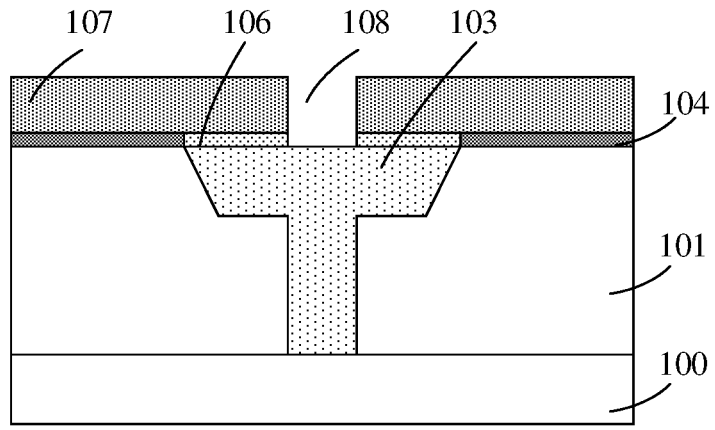
Figure 11:
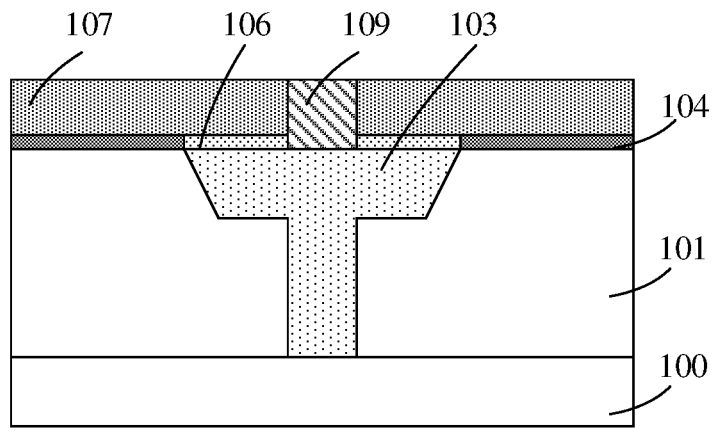

Referring to FIG. 10 and FIG. 11, subsequent to the step of forming a barrier layer 107, the method further includes: forming a metal layer 109 passing through the barrier layer 107 and the contact layer 106, the metal layer 109 being in contact with the upper surface of the metallic copper layer 103. The metal layer 109 is in contact with the metallic copper layer 103, and the two are electrically connected to form a conductive path.

In this embodiment, the step of forming a metal layer 109 includes: etching to remove a portion of the barrier layer 107 and portion of the contact layer 106 to expose the upper surface of portion of the metallic copper layer 103 to form a via 108; and forming the metal layer 109 on the exposed upper surface of the portion of the metallic copper layer 103.

The via 108 may be formed by a dry etching process. The via 108 formed by the dry etching process has a more regular shape, which facilitates the subsequent formation of the metal layer with a regular shape in the via 108. In other embodiments, the via may also be formed by a wet etching process.

The metal layer 109 may be formed by a chemical vapor deposition process. In other embodiments, the metal layer may also be formed by an atomic layer deposition process.

The metal layer 109 is made of tin, copper, aluminum, gold, silver or other materials. Gases used in the metal layer 109 formed by tungsten include silane and tungsten hexafluoride. In other embodiments, tungsten may also be prepared from diboron hexahydride and tungsten hexafluoride.

In the semiconductor structure formation method according to this embodiment, a contact layer is formed between a metallic copper layer and a barrier layer, a material of the contact layer contains cuprous ions, and the material of the contact layer contains a same element as a material of the barrier layer. The contact layer contains cuprous ions, which has similar chemical properties to the metallic copper layer; therefore, the contact layer formed on the upper surface of the metallic copper layer has good adhesion with the metallic copper layer, and no gap exists between the metallic copper layer and the contact layer. At the same time, since the material of the contact layer contains a same element as the material of the barrier layer, the contact layer and the barrier layer also have similar chemical properties and good adhesion therebetween. Based on the above, two opposite sides of the contact layer are closely bonded with the metallic copper layer and the barrier layer respectively, and no air gap or projection exists between the metallic copper layer and the barrier layer, which improves the contact performance of the metallic copper layer and the barrier layer.

A second embodiment of the present application provides a semiconductor structure. The semiconductor structure may be a semiconductor structure formed according to the semiconductor structure formation method in the first embodiment. The semiconductor structure according to the second embodiment of the present application is described in detail below with reference to the accompanying drawings.

Figure 12:
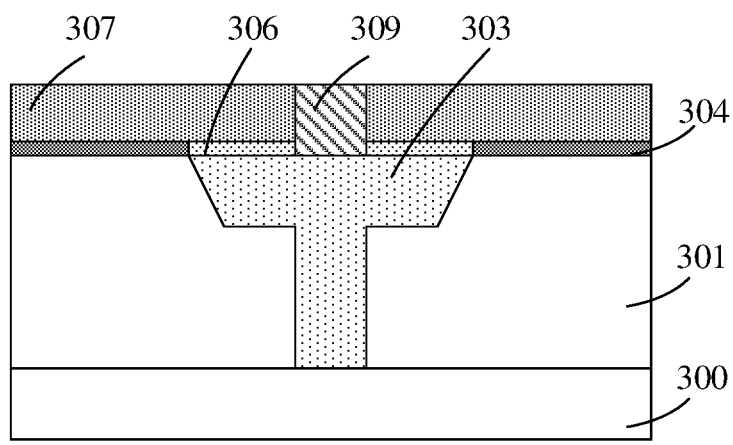
FIG. 12 is a schematic structural diagram of a semiconductor structure according to a second embodiment of the present application.

FIG. 12 is a schematic structural diagram of a semiconductor structure according to a second embodiment of the present application.

Referring to FIG. 12, the semiconductor structure according to this embodiment includes: a substrate 300, the substrate 300 having a dielectric layer 301, the dielectric layer 301 having a metallic copper layer 303, and the dielectric layer 301 exposing an upper surface of the metallic copper layer 303; a contact layer 306, the contact layer 306 being located on the upper surface of the metallic copper layer 303, and a material of the contact layer 306 containing cuprous ions; and a barrier layer 307, the barrier layer 307 being located on an upper surface of the contact layer 306, and a material of the barrier layer 307 containing a same element as the material of the contact layer 306.

The substrate 300 may be made of sapphire, silicon, silicon carbide, gallium arsenide, aluminum nitride, zinc oxide or the like. In this embodiment, the substrate 300 is made of a silicon material.

The dielectric layer 301 may be silicon oxide or a high dielectric material. The high dielectric material is specifically a ferroelectric ceramic material, a barium titanate based material or a lead titanate based material.

The metallic copper layer 303 is a conductive layer and may act as a gate of the semiconductor structure.

The semiconductor structure according to this embodiment further includes: a buffer layer 304, the buffer layer 304 being located between the dielectric layer 301 and the barrier layer 307.

The buffer layer 304 is formed between the dielectric layer 301 and the barrier layer 307. The contact layer 306 contains cuprous ions; in order to prevent contact of the two sides of the contact layer 306 with other structures in the semiconductor structure to conduct electricity, the buffer layer 304 is formed on the two sides of the contact layer 306 to achieve isolation and insulation effects, which helps improve the security of the semiconductor structure.

The buffer layer 304 may be made of silicon nitride, silicon oxide or the like. The buffer layer 304 has a thickness ranging from 5 nm to 10 nm, which may specifically be 6 nm, 7 nm or 8 nm. The buffer layer 304 is required to have only isolation and insulation functions. Therefore, the formed buffer layer 304 has a smaller thickness, which helps save manufacturing costs of the semiconductor structure.

The material of the contact layer 306 contains cuprous ions, which may specifically be cuprous thiocyanate. The contact layer 306 contains cuprous ions, which has similar chemical properties to the metallic copper layer 303; therefore, the contact layer 306 formed on the upper surface of the metallic copper layer 303 has good adhesion with the metallic copper layer 303, and no gap exists between the metallic copper layer 303 and the contact layer 306.

In this embodiment, the contact layer 306 has a thickness of 5 nm to 10 nm, which may specifically be 6 nm, 7 nm or 8 nm; and an upper surface of the buffer layer 304 is flush with the upper surface of the contact layer 306.

This indicates that the contact layer 306 has a same thickness as the buffer layer 304. The upper surface of the contact layer 306 and the upper surface of the buffer layer 304 form a uniform and flat surface, which facilitates subsequent formation of a barrier layer by deposition. Moreover, the contact layer 306 is required to only play a role of connecting the metallic copper layer 303 and the barrier layer. Therefore, the formed contact layer 306 has a smaller thickness, which helps save manufacturing costs of the semiconductor structure.

The material of the barrier layer 307 contains a same element as the material of the contact layer 306. Specifically, the material of the barrier layer 307 may be silicon carbon nitride. In other embodiments, the material of the barrier layer may also be tantalum nitride and other tantalum compounds.

Since the material of the contact layer 306 contains same elements as the material of the barrier layer 307, the contact layer 306 and the barrier layer 307 also have similar chemical properties and good adhesion therebetween, and no gap exists between the barrier layer 307 and the contact layer 306. It can be obtained that two opposite sides of the contact layer 306 are closely bonded to the metallic copper layer 303 and the barrier layer 307 respectively, and no gap or projection exists between the metallic copper layer 303 and the barrier layer 307, which improves the contact performance of the metallic copper layer 303 and the barrier layer 307.

In this embodiment, the semiconductor structure further includes: a metal layer 309, the metal layer 309 passing through the barrier layer 307 and the contact layer 306, and the metal layer 309 being in contact with the upper surface of the metallic copper layer 303.

The metal layer 309 is made of tin, copper, aluminum, gold, silver or other materials. Gases used in the metal layer 309 formed by tungsten include silane and tungsten hexafluoride. In other embodiments, tungsten may also be prepared from diboron hexahydride and tungsten hexafluoride.

In the semiconductor structure according to this embodiment, a contact layer is provided between the metallic copper layer and the barrier layer, a material of the contact layer contains cuprous ions, and the material of the contact layer contains same elements as a material of the barrier layer. The contact layer contains cuprous ions, which has similar chemical properties to the metallic copper layer; therefore, the contact layer on the upper surface of the metallic copper layer has good adhesion with the metallic copper layer, and no gap exists between the metallic copper layer and the contact layer. At the same time, since the material of the contact layer contains same elements as the material of the barrier layer, the contact layer and the barrier layer also have similar chemical properties and good adhesion therebetween. Based on the above, two opposite sides of the contact layer are closely bonded with the metallic copper layer and the barrier layer respectively, and no air gap or projection exists between the metallic copper layer and the barrier layer, which improves the contact performance of the metallic copper layer and the barrier layer.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A method of forming a semiconductor structure, comprising:
   providing a substrate, a dielectric layer on the substrate, the dielectric layer having a trench;
   forming a metallic copper layer filling the trench;
   forming a contact layer on an upper surface of the metallic copper layer, a material of the contact layer containing cuprous ions; and
   forming a barrier layer on an upper surface of the contact layer, a material of the barrier layer containing a same element as the material of the contact layer;
   wherein the material of the contact layer is cuprous thiocyanate, and the material of the barrier layer is silicon carbon nitride.

2. The method according to claim 1, wherein the step of forming a contact layer involves: forming an initial contact layer by a spin-on-dielectric process; and performing a thermal treatment to the initial contact layer to form the contact layer.

3. The method according to claim 2, wherein the spin-on-dielectric process comprises: the substrate, the dielectric layer and the metallic copper layer rotating at a rate of 500 to 3000 revolutions per minute during the spin-on-dielectric.

4. The method according to claim 2, wherein the thermal treatment comprises: a process temperature ranging from 70° C. to 80° C. during the thermal treatment to the initial contact layer; and a process duration ranging from 10 minutes to 20 minutes.

5. The method according to claim 1, prior to the step of forming a contact layer, further comprising: forming a buffer layer on an upper surface of the dielectric layer and an upper surface of the metallic copper layer; and etching to remove a portion of the buffer layer located on the upper surface of the metallic copper layer to expose at least the upper surface of the entire metallic copper layer.

6. The method according to claim 5, wherein after the portion of the buffer layer located on the upper surface of the metallic copper layer is removed, the contact layer is formed on the exposed upper surface of the entire metallic copper layer, and the upper surface of the contact layer is flush with an upper surface of a remaining portion of the buffer layer.

7. The method according to claim 6, wherein the step of forming a barrier layer comprises: forming the barrier layer on the upper surface of the contact layer and the upper surface of the remaining portion of the buffer layer.

8. The method according to claim 1, subsequent to the step of forming a barrier layer, further comprising: forming a metal layer passing through the barrier layer and the contact layer, the metal layer being in contact with the upper surface of the metallic copper layer.

9. The method according to claim 8, wherein the step of forming a metal layer comprises: etching to remove a portion of the barrier layer and a portion of the contact layer to expose the upper surface of a portion of the metallic copper layer; and forming the metal layer on the exposed upper surface of the portion of the metallic copper layer.

10. A semiconductor structure, comprising:
    a substrate, the substrate having a dielectric layer, the dielectric layer having a metallic copper layer, and the dielectric layer exposing an upper surface of the metallic copper layer;
    a contact layer, the contact layer being located on the upper surface of the metallic copper layer, and a material of the contact layer containing cuprous ions; and
    a barrier layer, the barrier layer being located on an upper surface of the contact layer, and a material of the barrier layer containing same elements as the material of the contact layer; and,
    wherein the material of the contact layer is cuprous thiocyanate, and the material of the barrier layer is silicon carbon nitride.

11. The semiconductor structure according to claim 10, further comprising: a buffer layer, the buffer layer being located between the dielectric layer and the barrier layer, and an upper surface of the buffer layer being flush with the upper surface of the contact layer.

12. The semiconductor structure according to claim 11, wherein the contact layer has a thickness of 5 nm to 10 nm.

13. The semiconductor structure according to claim 11, wherein the buffer layer has a thickness ranging from 5 nm to 10 nm.

14. The semiconductor structure according to claim 10, further comprising: a metal layer, the metal layer passing through the barrier layer and the contact layer, and the metal layer being in contact with the upper surface of the metallic copper layer.

* * * * *